US012634387B2

(12) United States Patent
Nishimura

(10) Patent No.: US 12,634,387 B2
(45) Date of Patent: *May 19, 2026

(54) DISPLAY DEVICE AND METHOD OF MANUFACTURING DISPLAY DEVICE

(71) Applicant: Magnolia White Corporation, Tokyo (JP)

(72) Inventor: Masumi Nishimura, Minato-ku (JP)

(73) Assignee: Magnolia White Corporation, Tokyo (JP)

( * ) Notice: Subject to any disclaimer, the term of this patent is extended or adjusted under 35 U.S.C. 154(b) by 58 days.

This patent is subject to a terminal disclaimer.

(21) Appl. No.: 18/752,963

(22) Filed: Jun. 25, 2024

(65) Prior Publication Data

US 2024/0349530 A1 Oct. 17, 2024

Related U.S. Application Data

(60) Continuation of application No. 17/714,233, filed on Apr. 6, 2022, now Pat. No. 12,048,189, which is a
(Continued)

(30) Foreign Application Priority Data

Jun. 29, 2017 (JP) ................................. 2017-127069

(51) Int. Cl.
*H04M 1/02* (2006.01)
*G06F 1/16* (2006.01)
(Continued)

(52) U.S. Cl.
CPC ........ *H04M 1/0269* (2022.02); *G06F 1/1652* (2013.01); *H01L 23/4985* (2013.01);
(Continued)

(58) Field of Classification Search
CPC ............... H04M 1/0269; G06F 1/1652; H01L 23/4985; H10F 77/1698; H10K 59/122;
(Continued)

(56) References Cited

U.S. PATENT DOCUMENTS 9,287,329 B1 3/2016 Lee et al.
11,335,886 B2 * 5/2022 Nishimura ........... H10N 30/875
(Continued)

FOREIGN PATENT DOCUMENTS

JP 2009289615 A 12/2009
JP 2016031499 A 3/2016

OTHER PUBLICATIONS

Japanese Office Action issued Apr. 27, 2021 in Japanese Patent Application No. 2017-127069 (w/English Translation), 10 pages.

*Primary Examiner* — Thanhha S Pham
(74) *Attorney, Agent, or Firm* — Maier & Maier, PLLC

(57) ABSTRACT

A display device includes a display panel including a display region, a terminal region provided with a terminal, and a bending region located between the display region and the terminal region and capable of bending, the terminal region being located on a rear surface side opposite to a display surface side with respect to the display region based on the bending region bent and a protective coating provided on the display surface side of the bending region. When a direction in which the display region, the bending region, and the terminal region are arranged is defined as a first direction and a direction crossing the first direction is defined as a second direction, the bending region includes a bank portion located in the second direction with respect to the protective coating, projecting to the display surface side, and extending in the first direction.

20 Claims, 6 Drawing Sheets

Related U.S. Application Data continuation of application No. 16/929,550, filed on Jul. 15, 2020, now Pat. No. 11,335,886, which is a continuation of application No. 16/571,266, filed on Sep. 16, 2019, now Pat. No. 10,748,976, which is a division of application No. 16/007,371, filed on Jun. 13, 2018, now Pat. No. 10,453,906.

(51) Int. Cl.

| | | |
|---|---|---|
| *H01L 23/498* | (2006.01) | |
| *H10F 77/169* | (2025.01) | |
| *H10K 59/122* | (2023.01) | |
| *H10K 59/173* | (2023.01) | |
| *H10K 59/80* | (2023.01) | |
| *H10K 77/10* | (2023.01) | |
| *H10N 30/87* | (2023.01) | |

(52) U.S. Cl.
CPC ....... *H10F 77/1698* (2025.01); *H10K 59/122* (2023.02); *H10K 59/173* (2023.02); *H10K 59/873* (2023.02); *H10K 77/111* (2023.02); *H10N 30/875* (2023.02); *H10K 59/8794* (2023.02)

(58) Field of Classification Search
CPC .. H10K 59/173; H10K 59/873; H10K 77/111; H10K 59/8794; H10N 30/875; Y02E 10/549; Y02P 70/50
See application file for complete search history.

(56) References Cited

U.S. PATENT DOCUMENTS

| | | | | |
|---|---|---|---|---|
| 12,048,189 | B2 * | 7/2024 | Nishimura | ........... H10K 59/122 |
| 2012/0098736 | A1 | 4/2012 | Yee | |
| 2017/0179432 | A1 | 6/2017 | Visweswaran et al. | |
| 2017/0213486 | A1 | 7/2017 | Zhou | |
| 2018/0083229 | A1 | 3/2018 | Tsuruoka | |
| 2018/0090702 | A1 | 3/2018 | Um et al. | |

* cited by examiner

FIG.4

DISPLAY DEVICE AND METHOD OF MANUFACTURING DISPLAY DEVICE

CROSS-REFERENCE TO RELATED APPLICATIONS

This application is a continuation of and claims the benefit of priority under 35 U.S.C. § 120 from U.S. application Ser. No. 17/714,233 filed Apr. 6, 2022, which is a continuation of U.S. application Ser. No. 16/929,550 filed Jul. 15, 2020 (now U.S. Pat. No. 11,335,886 issued May 17, 2022), which is a continuation of U.S. application Ser. No. 16/571,266 filed Sep. 16, 2019 (now U.S. Pat. No. 10,748,976 issued Aug. 18, 2020), which is a division of U.S. application Ser. No. 16/007,371 filed Jun. 13, 2018 (now U.S. Pat. No. 10,453,906 issued Oct. 22, 2019), and claims the benefit of priority under 35 U.S.C. § 119 from Japanese Application No. 2017-127069 filed Jun. 29, 2017, the entire contents of each of which are incorporated herein by reference.

BACKGROUND OF THE INVENTION

1. Field of the Invention

The present invention relates to a display device and a method of manufacturing the display device.

2. Description of the Related Art

In recent years, it has been required to narrow a so-called picture-frame region (narrower picture frame) located around a display region in order to downsize a display device or expand the display region. In particular, the demand for the narrower picture frame has increased in a mobile apparatus such as a smartphone.

As one example of achieving the narrower picture frame, JP 2016-31499 A discloses that, in a display panel using a flexible resin film as a base material and capable of bending, the narrower picture frame is achieved by bending a region outside the display region to the rear surface side.

SUMMARY OF THE INVENTION

Incidentally, a protective coating may be provided in a bending region for the purpose of protecting a wiring line and the like because there is a risk of breakage of the wiring line and the like due to a stress acting on the bending region when the display panel is bent.

The display panel may be cut to adjust its external form. When the outer edge of the protective coating is located on the outside of the cut line, there is a risk of impairment of reliability of the protective coating due to damage to the protective coating because the protective coating is cut together with the display panel.

On the other hand, when the outer edge of the protective coating is located on the inside of the cut line, there is a risk of impairment of coatability of the protective coating because the edge portion of the protective coating formed by application becomes too thin.

The invention has been made in view of the problems described above, and it is an object of the invention to provide a display device in which it is possible to secure the thickness of the edge portion of a protective coating while locating the outer edge of the protective coating on the inside of the outer edge of a display panel, and a method of manufacturing the display device.

According to one aspect of the present invention, there is provided a display device. The display device includes a display panel including a display region, a terminal region provided with a terminal, and a bending region located between the display region and the terminal region and capable of bending, the terminal region being located on a rear surface side opposite to a display surface side with respect to the display region based on the bending region bent; and a protective coating provided on the display surface side of the bending region. When a direction in which the display region, the bending region, and the terminal region are arranged is defined as a first direction and a direction crossing the first direction is defined as a second direction, the bending region includes a bank portion located in the second direction with respect to the protective coating, projecting to the display surface side, and extending in the first direction.

In the above-mentioned aspects of the invention, the bank portion is located on both sides with respect to the protective coating in the second direction.

In the above-mentioned aspects of the invention, the bank portion is formed over the whole of the bending region in the first direction.

In the above-mentioned aspects of the invention, the bending region includes a base material, a wiring line provided on the display surface side of the base material, and an insulating film covering the wiring line. The bank portion is formed apart from the insulating film in the second direction.

In the above-mentioned aspects of the invention, a groove is formed between the insulating film and the bank portion.

In the above-mentioned aspects of the invention, the bank portion is formed of the same material as the insulating film.

In the above-mentioned aspects of the invention, the protective coating covers the whole of the insulating film in the second direction.

In the above-mentioned aspects of the invention, an outer edge of the protective coating is in contact with the bank portion.

In the above-mentioned aspects of the invention, the display device further includes a rear surface film including a first film portion attached to the rear surface side of the display region and a second film portion attached to the rear surface side of the terminal region.

In the above-mentioned aspects of the invention, the display device further includes a spacer interposed between the display region and the terminal region and in contact with the rear surface side of the bending region.

According to another aspect of the present invention, there is provided a method of manufacturing a display device including a step of preparing a display panel. The display panel includes a display region, a terminal region provided with a terminal, and a bending region located between the display region and the terminal region and capable of bending, the bending region including, when a direction in which the display region, the bending region, and the terminal region are arranged is defined as a first direction and a direction crossing the first direction is defined as a second direction, a bank portion located on the outside with respect to a wiring portion in the second direction, projecting to a display surface side, and extending in the first direction. The method includes a step of providing a protective coating on the inside with respect to the bank portion in the second direction on the display surface side of the bending region. The method includes a step of bending the bending region and locating the terminal region on a rear surface side opposite to the display surface side with respect to the display region.

In the above-mentioned aspects of the invention, the method of manufacturing the display device further includes a step of cutting the display panel on the outside with respect to the bank portion in the second direction.

BRIEF DESCRIPTION OF THE DRAWINGS

FIG. 4 is an enlarged view of a main portion in FIG. 3.

DETAILED DESCRIPTION OF THE INVENTION

Figure 1:
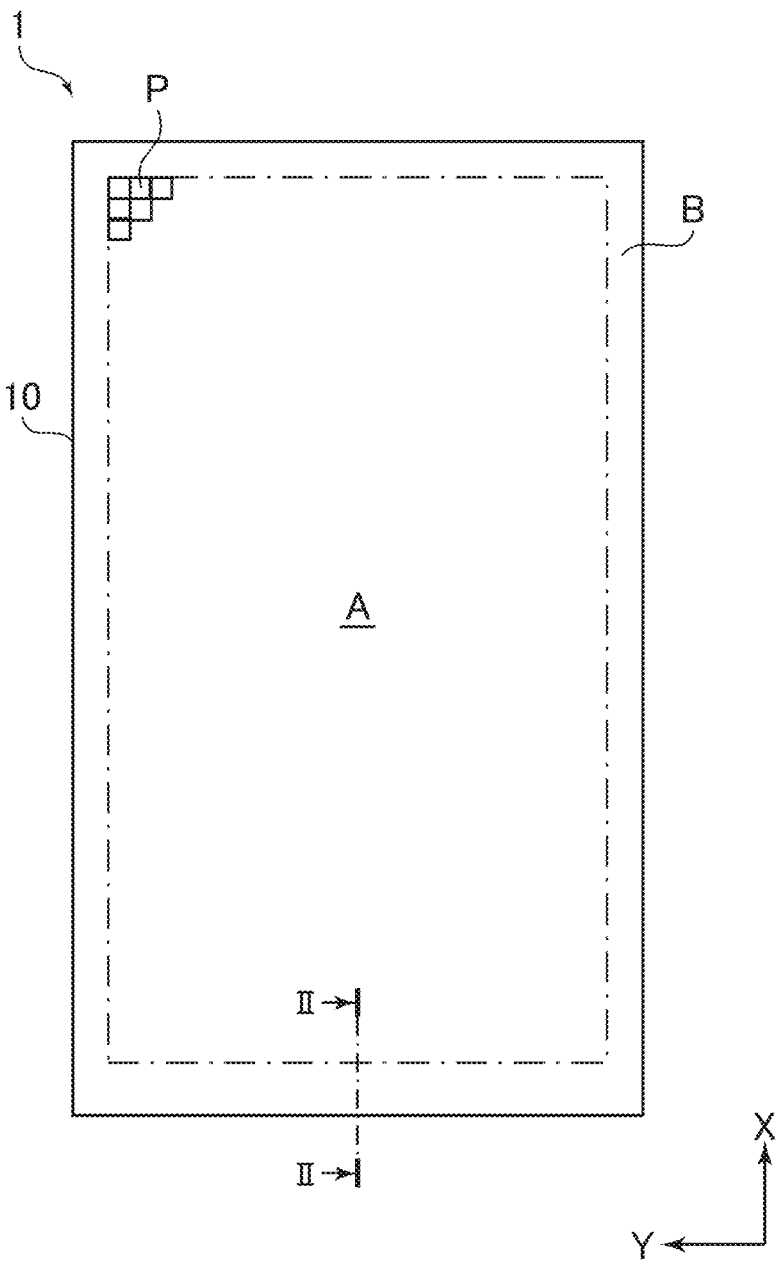
FIG. 1 is a plan view of a display device according to an embodiment.

Hereinafter, each embodiment of the invention will be described with reference to the drawings. The disclosure is illustrative only. Appropriate modifications that will readily occur to those skilled in the art and fall within the spirit of the invention are of course included in the scope of the invention. In the drawings, for more clarity of description, the width, thickness, shape, and the like of each part may be schematically represented, compared to those in embodiments. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

Figure 2:
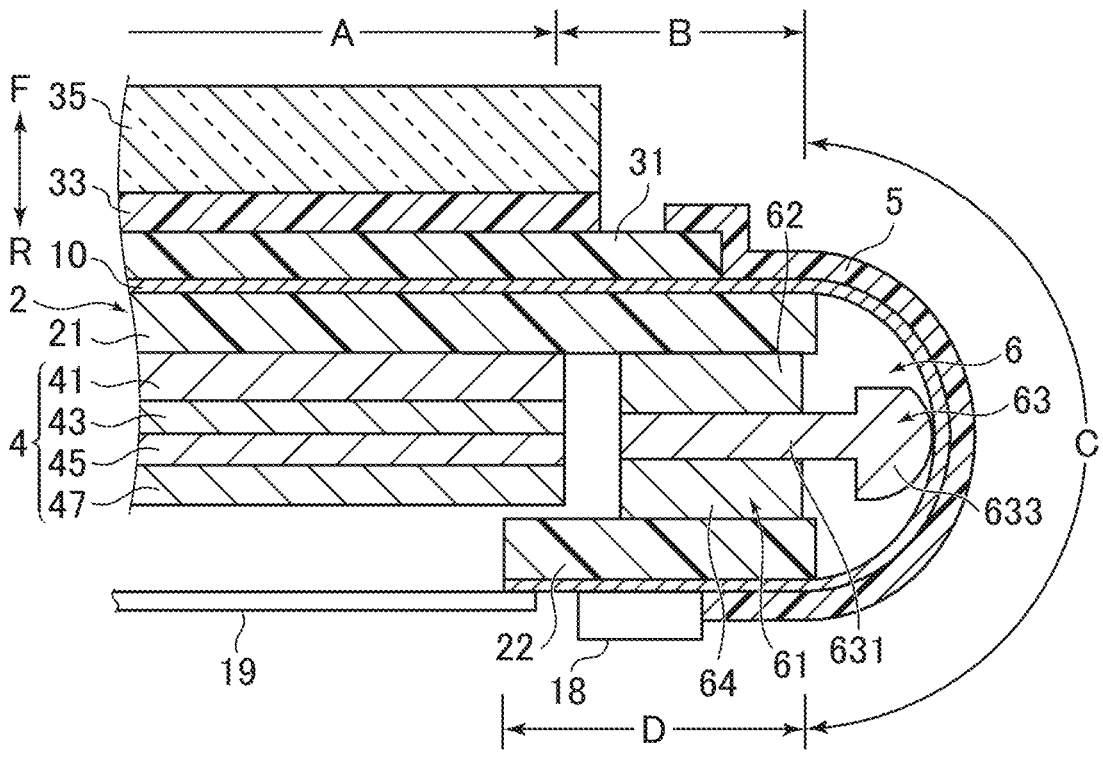
FIG. 2 is a cross-sectional view taken along line II-II shown in FIG. 1.
Figure 3:
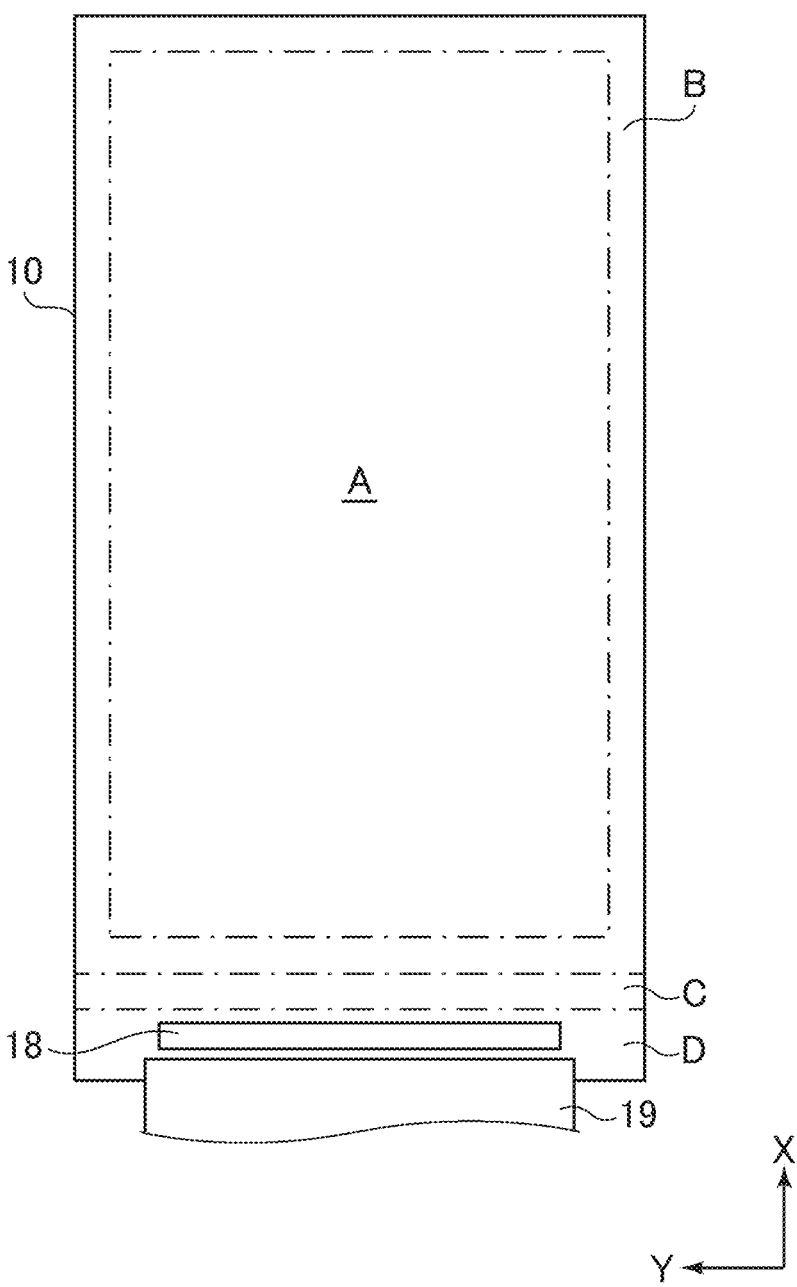
FIG. 3 is a plan view showing a display panel before bending.
Figure 4:
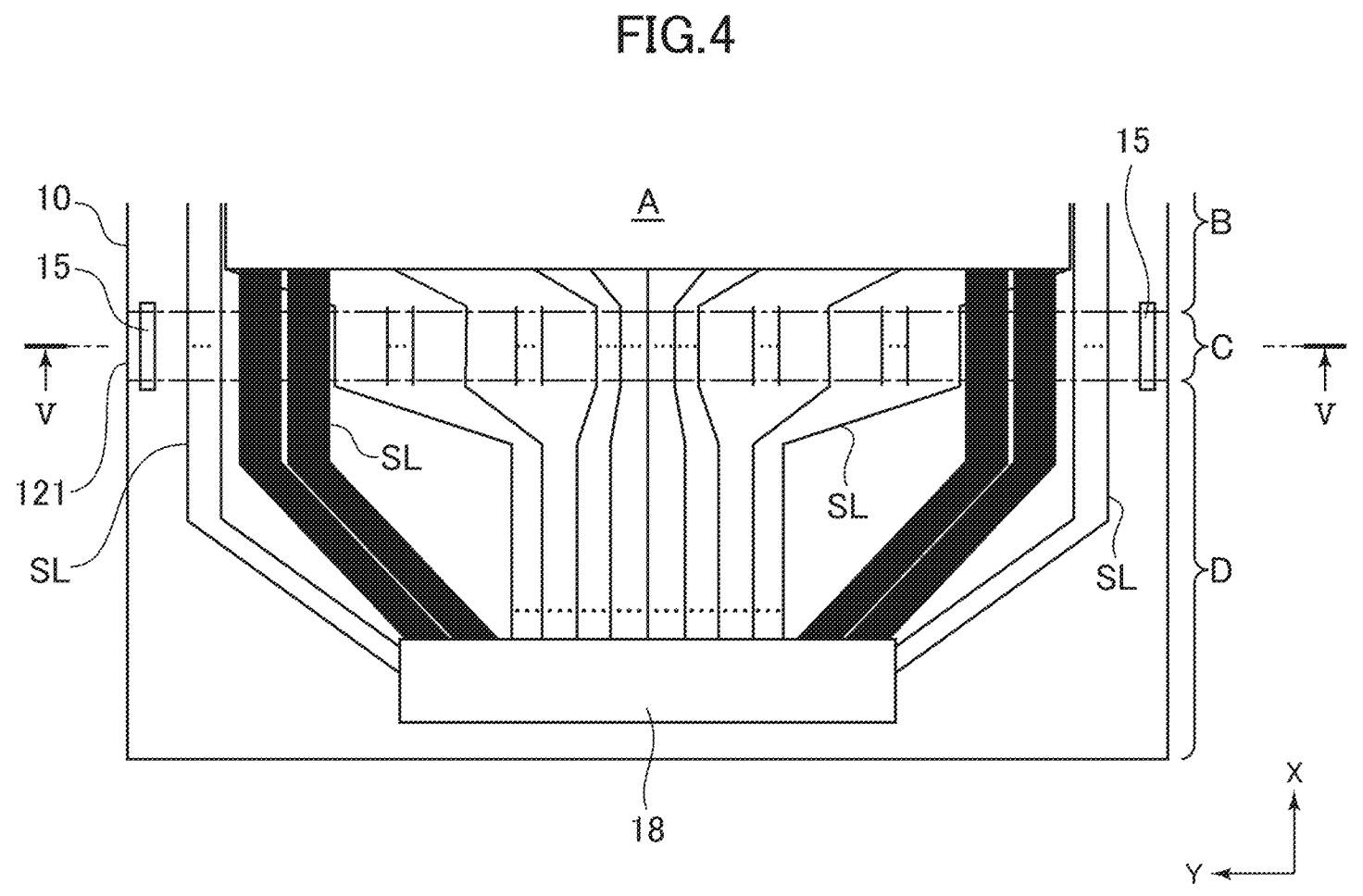
Figure 5:
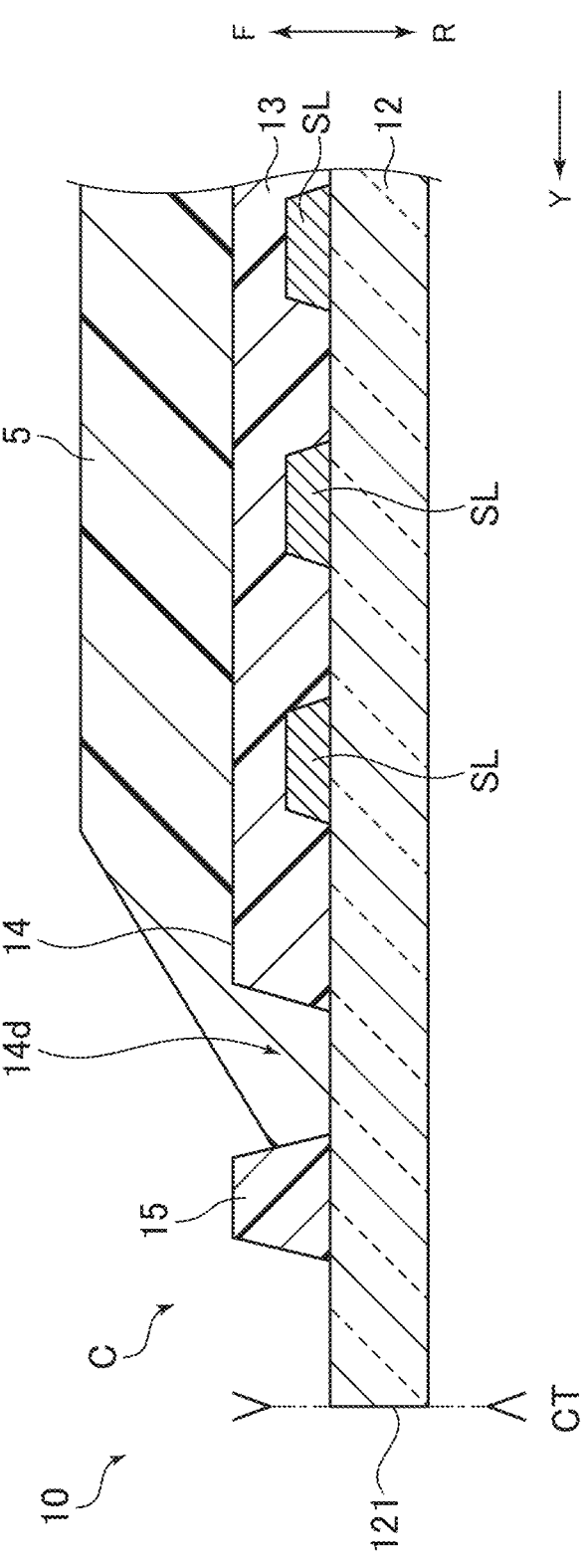
FIG. 5 is a cross-sectional view taken along line V-V shown in FIG. 4.

FIG. 1 is a plan view of a display device 1 according to an embodiment. FIG. 2 is a cross-sectional view taken along line II-II shown in FIG. 1. FIG. 3 is a plan view showing a display panel 10 before bending. FIG. 4 is an enlarged view of a main portion in FIG. 3. FIG. 5 is a cross-sectional view taken along line V-V shown in FIG. 4.

The display device 1 is, for example, an organic EL display device including an organic light emitting diode as a display element. The display device 1 includes the display panel 10 using a flexible film as a base material and capable of bending. The flexible film is formed of, for example, a resin material such as polyimide. The display panel 10 includes a display region A, a picture-frame region B surrounding the display region A, a bending region C adjacent to one side of the picture-frame region B, and a terminal region D adjacent to the bending region C.

The X-direction in FIGS. 1 and 3 to 5 represents a direction (an example of a first direction) in which the display region A, the bending region C, and the picture-frame region B are arranged while the Y-direction represents a direction (an example of a second direction) crossing (e.g., orthogonal to) the X-direction. The F-direction in FIG. 2 represents a display surface side while the R-direction represents a rear surface side.

Full-color pixels P in each of which unit pixels (sub-pixels) of a plurality of colors of, for example, red, green, and blue are combined are arranged in a matrix in the display region A. A peripheral circuit may be disposed in the picture-frame region B. Terminals (not shown) are provided in the terminal region D, and an integrated circuit chip (IC chip) 18 and a flexible printed circuit (FPC) 19 are connected to the terminal region D. The IC chip 18 may be mounted on the FPC 19.

The pixels P in the display region A and the terminals in the terminal region D are electrically connected through wiring lines SL (see FIGS. 4 and 5) passing through the picture-frame region B and the bending region C. The display panel 10 is bent at the bending region C, and the terminal region D is located on the rear surface side of the display region A. With this configuration, a narrower picture frame is realized.

As shown in FIG. 2, a rear surface film 2 is attached to the rear surface of the display panel 10. The rear surface film 2 is formed of, for example, a resin material such as PET, and is attached to the display panel 10 with, for example, a resin-based adhesive. The rear surface film 2 includes a first film portion 21 attached to the rear surfaces of the display region A and the picture-frame region B, and a second film portion 22 attached to the rear surface of the terminal region D. The rear surface film 2 is not attached to the bending region C.

With the bending region C bent, the terminal region D and the second film portion 22 are located on the rear surface side of the display region A, the picture-frame region B, and the first film portion 21. That is, the first film portion 21 and the second film portion 22 are located inside the display panel 10 bent. The rear surface of the first film portion 21 and the rear surface of the second film portion 22 face each other.

An optical transparent film 31 is provided on the display surface side of the display panel 10. The optical transparent film 31 is formed of, for example, a resin material such as PET. A circularly polarizing film 33 is provided on the optical transparent film 31. A cover glass 35 is provided on the circularly polarizing film 33.

A stacked film 4 is attached to the rear surface of the first film portion 21. The stacked film 4 includes a buffer film 41, a first heat dissipation film 43, a second heat dissipation film 45, and an adhesive tape 47. The buffer film 41 is also called a cushion tape, and is formed of, for example, a resin foam material. The first heat dissipation film 43 and the second heat dissipation film 45 are films formed of, for example, graphite or metal such as copper.

A spacer 6 for guiding the bending of the bending region C of the display panel 10 is disposed between the first film portion 21 and the second film portion 22 of the rear surface film 2. The spacer 6 is interposed between the first film portion 21 and the second film portion 22, and is in contact with the rear surface of the bending region C. The spacer 6 suppresses excessive bending of the bending region C and also maintains a constant bend.

The spacer 6 includes an interposed portion 61 interposed between the first film portion 21 and the second film portion 22, and a projecting portion 633 projecting outward from the interposed portion 61 to be in contact with the rear surface of the bending region C. More specifically, the spacer 6 includes a main body 63 including a base portion 631 and the projecting portion 633, and adhesive layers 62 and 64 interposing the base portion 631 of the main body 63 therebetween. The interposed portion 61 is composed of the base portion 631 of the main body 63 and the adhesive layers 62 and 64 interposing the base portion 631 therebetween.

The main body 63 is attached to the rear surface of the first film portion 21 through the adhesive layer 62, and is attached to the rear surface of the second film portion 22 through the adhesive layer 64. The main body 63 is formed of, for example, a resin molded article or the like. The adhesive layers 62 and 64 are each formed of, for example, a resin-based adhesive, a double-faced tape, or the like. The tip portion of the projecting portion 633 expands in a mushroom form in a side view, and includes a contact face that is curved along the bending region C.

A protective coating 5 is provided on the display surface side of the bending region C. The protective coating 5 is formed of, for example, a resin material such as epoxy resin. The protective coating 5 is formed by, for example, applying a resin material in a liquid form to the display surface side of the bending region C and curing the resin material.

As shown in FIG. 4, the plurality of wiring lines SL for electrically connecting the pixels P in the display region A with the terminals in the terminal region D pass transversely in the X-direction through the bending region C. The plurality of wiring lines SL extend in the X-direction, and are arranged in the Y-direction. The plurality of wiring lines SL include, for example, scanning lines for supplying a scanning signal to the pixels P, signal lines for supplying a video signal to the pixels P, and power supply voltage lines for supplying a power supply voltage to the pixels P.

As shown in FIG. 5, the plurality of wiring lines SL are provided on a base material 12, and are covered by an insulating film 13. The plurality of wiring lines SL and the insulating film 13 covering the plurality of wiring lines SL constitute a wiring portion 14. The insulating film 13 is covered by the protective coating 5. The invention is not limited to the stacked structure shown in the drawing, and another insulating film may be provided between the base material 12 and the wiring lines SL, between the wiring lines SL and the insulating film 13, or on the insulating film 13 or the like.

The base material 12 is a flexible film formed of, for example, a resin material such as polyimide. The insulating film 13 is an organic planarization film formed of, for example, an organic insulating material such as acrylic resin and provided below pixel electrodes of the pixels P. The wiring line SL is formed simultaneously with and in the same layer as, for example, a source-drain line of a thin film transistor of the pixel P.

The bending region C includes a bank portion 15 for damming up the protective coating 5. The bank portion 15 is located in the Y-direction with respect to the protective coating 5, projects to the display surface side, and extends in the X-direction. The bank portion 15 is provided in the vicinity of an outer edge 121 of the bending region C in the Y-direction, and is located on the outside with respect to the protective coating 5 in the Y-direction. The outer edge 121 of the bending region C is an outer edge that is formed by cutting the base material 12 of the display panel 10. The bank portion 15 is located slightly on the inside of the outer edge 121 of the bending region C in the Y-direction.

The bank portion 15 is located on both sides with respect to the protective coating 5 in the Y-direction. That is, a pair of the bank portions 15 are provided apart from each other in the Y-direction, and the protective coating 5 is formed between the pair of bank portions 15.

The bank portion 15 extends in the X-direction. Specifically, the bank portion 15 is formed over the whole of the bending region C in the X-direction. The bank portion 15 is not limited to the bending region C. The bank portion 15 may extend to the picture-frame region B, or may extend to the terminal region D. Moreover, the bank portion 15 does not need to be completely continuous but may be disconnected at some midpoint.

The bank portion 15 is formed apart from the insulating film 13 covering the wiring lines SL in the Y-direction. The bank portion 15 is apart from the insulating film 13 to the outside in the Y-direction. That is, the insulating film 13 is apart from the bank portion 15 to the inside in the Y-direction. The insulating film 13 is located between the pair of bank portions 15 apart from each other in the Y-direction.

A groove 14d is formed between the insulating film 13 and the bank portion 15. The surface of the base material 12 is the bottom of the groove 14d. Specifically, the groove 14d is formed of a side wall of the insulating film 13 on the outside in the Y-direction, a side wall of the bank portion 15 on the inside in the Y-direction, and the surface of the base material 12.

The bank portion 15 is formed of the same material as the insulating film 13. That is, the insulating film 13 and the bank portion 15 are formed of, for example, an organic insulating material such as acrylic resin. The insulating film 13, the bank portion 15, and the groove 14d therebetween are obtained by, for example, forming a uniform film (so-called solid film) on the entire surface of the base material 12 and patterning the uniform film. The invention is not limited to this configuration. The bank portion 15 may be provided separately from the insulating film 13.

The outer edge of the protective coating 5 is in contact with the bank portion 15. Specifically, the outer edge of the protective coating 5 is in contact with the side wall of the bank portion 15 on the inside in the Y-direction. In other words, the protective coating 5 is dammed up by the bank portion 15. During the formation of the protective coating 5, the resin material in a liquid form, which is applied to the bending region C, spreads to the outside in the Y-direction, but is dammed up by the bank portion 15. With this configuration, it is possible to locate the outer edge of the protective coating 5 on the inside of the outer edge 121 (i.e., a cut line CT) of the bending region C in the Y-direction.

Moreover, it is also possible, by providing the bank portion 15, to secure the thickness of the edge portion of the protective coating 5. For example, when it is intended to keep the outer edge of the resin material in a liquid form at a position just before the cut line CT without providing the bank portion 15, there is a risk of failing to cover the whole of the insulating film 13 (especially the corner portion on the outside in the Y-direction) because the edge portion becomes too thin. Therefore, by providing the bank portion 15 so as to dam up the resin material in a liquid from, it is possible to cover the whole of the insulating film 13 in the Y-direction while securing the thickness of the edge portion of the protective coating 5.

Hereinafter, a method of manufacturing the display device according to an embodiment will be described. The manufacturing method mainly includes: a first step of preparing the display panel 10; a second step of providing the protective coating 5 in the bending region C of the display panel 10; a third step of bending the display panel 10; and a fourth step of cutting the display panel 10.

In the first step, the display panel 10 is prepared as shown in FIG. 3 described above. The rear surface film 2 (see FIG. 2) is attached to the rear surfaces of the display region A, the picture-frame region B, and the terminal region D of the display panel 10. Moreover, the IC chip 18 and the FPC 19 are connected to the terminal region D of the display panel 10. Here, the bank portion 15 is provided in the bending region C of the display panel 10 as shown in FIGS. 4 and 5 described above.

In the second step, the protective coating 5 is provided in the bending region C of the display panel 10 as shown in FIG. 5 described above. The protective coating 5 is formed by, for example, applying a resin material in a liquid form to the bending region C and curing the resin material. At this time, the resin material in a liquid form is dammed up by the bank portion 15. Therefore, the outer edge of the protective coating 5 is located on the inside of the cut line CT, and the thickness of the edge portion of the protective coating 5 is secured.

Figure 6:
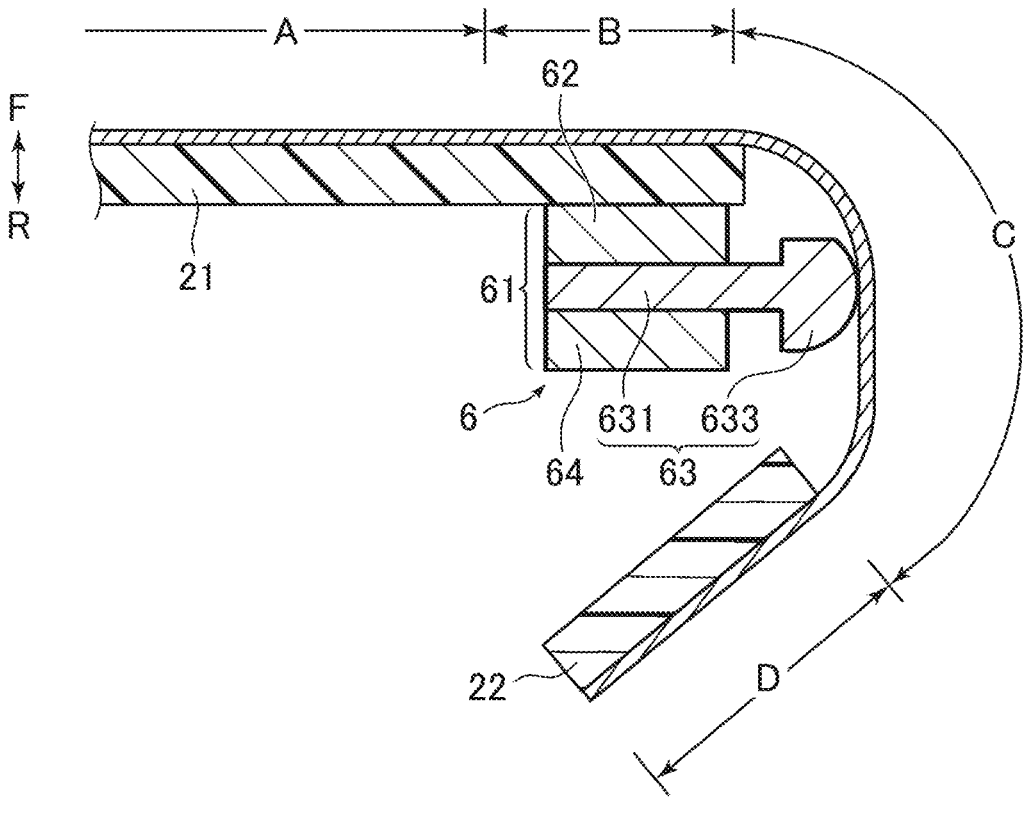
FIG. 6 is a diagram showing a step of a method of manufacturing the display device according to an embodiment.

In the third step, the bending region C of the display panel 10 is bent as shown in FIG. 6. FIG. 6 shows a state in the middle of bending. In FIG. 6, only the display panel 10 and the rear surface film 2 are shown while the other configurations are omitted. The terminal region D and the second film portion 22 are located on the rear surface side of the display region A, the picture-frame region B, and the first film portion 21 by bending the bending region C.

The bending of the bending region C is guided by the spacer 6. More specifically, the spacer 6 is first attached to the rear surface of the first film portion 21 with the adhesive layer 62. Next, the bending region C is bent. Here, the bending region C is bent while bringing the projecting portion 633 of the spacer 6 into contact with the rear surface of the bending region C in the middle of bending. Next, the spacer 6 is interposed between the first film portion 21 and the second film portion 22, and the spacer 6 is attached to the rear surface of the second film portion 22 with the adhesive layer 64. The order of attachment of the spacer 6 may be reversed.

In the fourth step, the display panel 10 is cut along the cut line CT shown in FIG. 5 described above. The cut line CT is located on the outside with respect to the bank portion 15 in the Y-direction. For this reason, the protective coating 5 is not cut in cutting the display panel 10.

In the embodiment, an organic EL display device has been exemplified as an example of the disclosure. However, other application examples include all types of flat panel display devices such as a liquid crystal display device and other self-emitting display devices, or an electronic paper display device including an electrophoretic element. Moreover, it is needless to say that the invention can be applied, without particular limitations, to small and medium to large sized display devices.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a display panel including a flexible substrate, a display region on a first surface of the flexible substrate, a terminal region on the first surface of the flexible substrate, and a bending region between the display region and the terminal region; and
   a resin layer covering the first surface of the flexible substrate at the bending region, wherein the bending region includes a first bank,
the first bank is between a first edge of the flexible substrate and the resin layer in a planar view,
the resin layer is in contact with the first bank,
the resin layer is formed apart from the first edge of the flexible substrate,
the bending region includes a base material, a wiring line on the first surface of the flexible substrate, and an insulating film covering the wiring line, and
the first bank is formed apart from the insulating film.

2. The display device according to claim 1, wherein
a direction in which the display region, the bending region, and the terminal region are arranged is defined as a first direction and a direction crossing the first direction is defined as a second direction, and
the first bank extends in the first direction.

3. The display device according to claim 1, wherein
a groove is formed between the insulating film and the first bank.

4. The display device according to claim 3, wherein
the resin layer overlaps with at least a part of the groove.

5. The display device according to claim 1, wherein
the first bank is formed of a same material as the insulating film.

6. The display device according to claim 1, wherein
a direction in which the display region, the bending region, and the terminal region are arranged is defined as a first direction and a direction crossing the first direction is defined as a second direction, and
the resin layer covers a whole of the insulating film in the second direction.

7. The display device according to claim 1, wherein
the resin layer covers an edge of the insulating film.

8. The display device according to claim 1, further comprising:
   a second bank, wherein
   the second bank is between a second edge of the flexible substrate and the resin layer in the planar view,
   the resin layer is between the first bank and the second bank in the planar view,
   the resin layer is in contact with the second bank, and
   the resin layer is formed apart from the second edge of the flexible substrate.

9. The display device according to claim 8, wherein
the first bank and the second bank are between the first edge of the flexible substrate and the second edge of the flexible substrate in the planar view.

10. A display device comprising:
   a display panel including a flexible substrate, a display region on a first surface of the flexible substrate, a terminal region on the first surface of the flexible substrate, and a bending region between the display region and the terminal region, wherein
   the bending region includes a pair of bank portions,
   the bending region includes a base material, a wiring line on the first surface of the flexible substrate, and an insulating film covering the wiring line, and
   the pair of bank portions are formed apart from the insulating film.

11. The display device according to claim 10, wherein
a direction in which the display region, the bending region, and the terminal region are arranged is defined as a first direction and a direction crossing the first direction is defined as a second direction, and
each of the pair of bank portions extends in the first direction.

12. The display device according to claim 10, wherein a groove is formed between the insulating film and each of the pair of bank portions.

13. The display device according to claim 12, further comprising:

a resin layer covering the first surface of the flexible substrate at the bending region, wherein one of the pair of bank portions is between a first edge of the flexible substrate and the resin layer in a planar view, another one of the pair of bank portions is between a second edge of the flexible substrate and the resin layer in the planar view, and the resin layer overlaps with at least a part of the groove.

14. The display device according to claim 13, wherein a direction in which the display region, the bending region, and the terminal region are arranged is defined as a first direction and a direction crossing the first direction is defined as a second direction, and the resin layer covers a whole of the insulating film in the second direction.

15. The display device according to claim 10, wherein the pair of bank portions are formed of a same material as the insulating film.

16. A display device comprising:

a display panel including a flexible substrate, a display region on a first surface of the flexible substrate, a terminal region on the first surface of the flexible substrate, and a bending region between the display region and the terminal region; and a resin layer covering on the first surface of the flexible substrate at the bending region, wherein the bending region includes a pair of bank portions, one of the pair of bank portions is between a first edge of the flexible substrate and the resin layer in a planar view, another one of the pair of bank portions is between a second edge of the flexible substrate and the resin layer in the planar view, each of the pair of bank portions is formed apart from each other, the resin layer is between the pair of bank portions in the planar view, the resin layer is in contact with both of the pair of bank portions, the resin layer is neither in contact with the first edge of the flexible substrate nor the second edge of the flexible substrate, the bending region includes a base material, a wiring line on the first surface of the flexible substrate, and an insulating film covering the wiring line, and the pair of bank portions are formed of a same material as the insulating film.

17. The display device according to claim 16, wherein a direction in which the display region, the bending region, and the terminal region are arranged is defined as a first direction and a direction crossing the first direction is defined as a second direction, and each of the pair of bank portions extends in the first direction.

18. The display device according to claim 16, wherein the bank portions are formed apart from the insulating film.

19. The display device according to claim 16, wherein a groove is formed between the insulating film and each of the pair of bank portions.

20. The display device according to claim 16, wherein a direction in which the display region, the bending region, and the terminal region are arranged is defined as a first direction and a direction crossing the first direction is defined as a second direction, and the resin layer covers a whole of the insulating film in the second direction.

\* \* \* \* \*